(12) United States Patent
Fury et al.

(10) Patent No.: US 7,361,231 B2
(45) Date of Patent: Apr. 22, 2008

(54) SYSTEM AND METHOD FOR MID-PRESSURE DENSE PHASE GAS AND ULTRASONIC CLEANING

(75) Inventors: Michael A. Fury, San Francisco, CA (US); Robert Wade Sherrill, San Rafael, CA (US)

(73) Assignee: EKC Technology, Inc., Hayward, CA (US)

( * ) Notice: Subject to any disclaimer, the term of this patent is extended or adjusted under 35 U.S.C. 154(b) by 0 days.

(21) Appl. No.: 11/173,603

(22) Filed: Jul. 1, 2005

(65) Prior Publication Data

US 2007/0000521 A1    Jan. 4, 2007

(51) Int. Cl.
*C23G 1/00* (2006.01)

(52) U.S. Cl. .............. 134/2; 134/1; 134/26; 134/29; 134/34; 134/36; 134/42; 134/902

(58) Field of Classification Search ............ 134/2, 134/1, 26, 29, 34, 36, 42, 902
See application file for complete search history.

(56) References Cited

U.S. PATENT DOCUMENTS

| | | | |
|---|---|---|---|
| 4,443,269 A | 4/1984 | Capella et al. ............. 134/12 |
| 5,013,366 A | 5/1991 | Jackson et al. ............. 134/1 |
| 5,294,261 A * | 3/1994 | McDermott et al. ......... 134/7 |
| 5,339,844 A * | 8/1994 | Stanford et al. ........... 134/107 |
| 5,355,901 A | 10/1994 | Mielnik et al. ............ 134/105 |
| 5,417,768 A | 5/1995 | Smith, Jr. et al. .......... 134/10 |
| 5,482,211 A | 1/1996 | Chao et al. ................ 239/135 |
| 5,505,219 A * | 4/1996 | Lansberry et al. .......... 134/105 |
| 5,509,431 A | 4/1996 | Smith, Jr. et al. .......... 134/95.1 |
| 5,526,834 A | 6/1996 | Mielnik et al. ............ 134/105 |
| 5,944,996 A | 8/1999 | DeSimone et al. ......... 210/634 |
| 6,200,393 B1 | 3/2001 | Romack et al. ............ 134/10 |
| 6,224,774 B1 * | 5/2001 | DeSimone et al. ......... 210/634 |
| 6,486,789 B2 * | 11/2002 | Germagian et al. ....... 340/693.5 |
| 6,500,605 B1 * | 12/2002 | Mullee et al. ............. 430/329 |
| 6,509,141 B2 | 1/2003 | Mullee .................... 430/329 |
| 6,558,475 B1 | 5/2003 | Jur et al. ................... 134/21 |
| 6,688,115 B1 * | 2/2004 | Gershtein .................. 62/54.1 |
| 2003/0202792 A1 * | 10/2003 | Goshi ....................... 396/564 |
| 2004/0031441 A1 * | 2/2004 | Muraoka et al. ........... 118/715 |
| 2004/0055621 A1 * | 3/2004 | McDermott et al. ........ 134/1.3 |
| 2004/0123484 A1 * | 7/2004 | Yoshikawa et al. ......... 34/410 |
| 2005/0183740 A1 * | 8/2005 | Fulton et al. .............. 134/3 |
| 2005/0189001 A1 * | 9/2005 | Lin .......................... 134/2 |

* cited by examiner

*Primary Examiner*—Sharidan Carrillo
(74) *Attorney, Agent, or Firm*—Morgan Lewis & Bockius LLP

(57) ABSTRACT

Workpieces are loaded into a cleaning chamber. The cleaning chamber is pressurized with a first dense-phase cleaning fluid, the temperature and pressure of the first dense-phase fluid being maintained at less than about 1500 psi using a temperature control device. The workpieces are soaked in the first dense-phase fluid for a predetermined time period. After soaking, the workpieces are further cleaned by applying a second, localized, high-pressure dense-phase fluid to the surface of the workpieces.

11 Claims, 7 Drawing Sheets

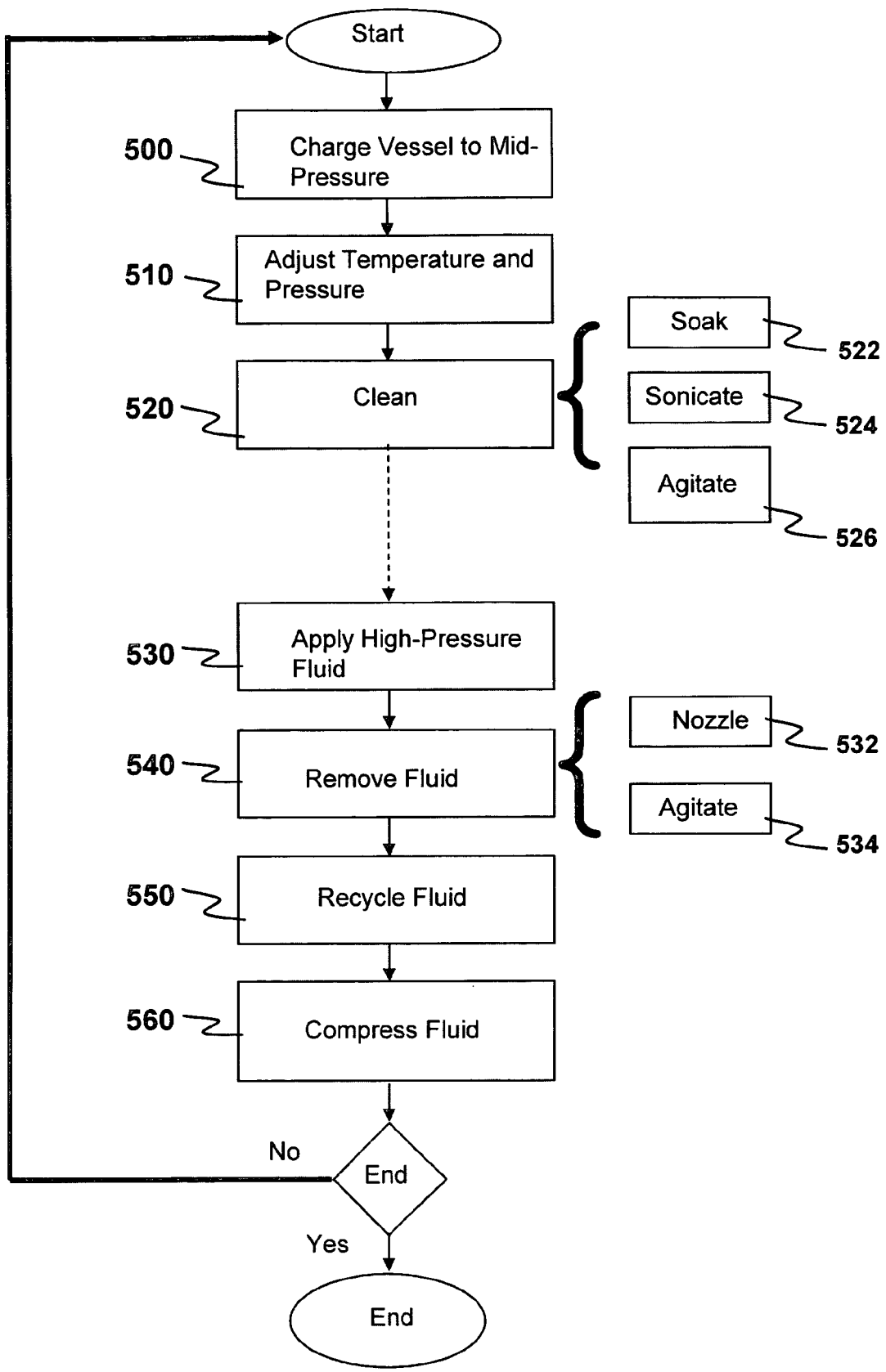

SYSTEM AND METHOD FOR MID-PRESSURE DENSE PHASE GAS AND ULTRASONIC CLEANING

BACKGROUND OF THE INVENTION

1. Field of the Invention

The present invention relates generally to a mid-pressure cleaning system that uses dense-phase fluids to remove photoresist and photoresist processing residues. In particular, the present invention relates to a system and method for mid-pressure dense phase gas and ultrasonic cleaning. By mid-pressure it is meant that the cleaning system is generally used at pressures between atmospheric and about 1500 psi.

2. Description of the Related Art

Generally, semiconductor substrates, such as circular wafers, are processed into semiconductor chips by sequentially exposing each substrate to a number of individual processes, such as photomasking, etching, implantation, and cleaning. Cleaning typically consists of removing resist and/or etching residue from the surface of the substrate.

Generally, there are two methods for cleaning the surface of a substrate, namely, wet and dry processing. Wet processing consists of a series of steps of spraying and/or immersing the substrate in chemical solutions or solvents. These conventional solvent-aided cleaning processes are currently being re-evaluated due to environmental concerns. In addition, recent environmental legislation mandates that many of the organic solvents used in wet processes be banned or their use severely limited. Dry processing, on the other hand, consists of a series of steps that use gases instead of wet chemical solutions to clean the substrate. For example, ashing using an $O_2$ plasma. However, such processes often leave a residue after dry cleaning, which is unacceptable because such residue may cause device failures or limit operation efficiency.

More recently, dense phases gases or fluids, such as carbon dioxide ($CO_2$) with or without co-solvents or surfactants, have been introduced to remove etch residue and/or photoresist from semiconductor substrates. A dense phase fluid is a gas compressed to either supercritical or subcritical conditions to achieve liquid-like densities. These dense phase fluids or fluid mixtures are also referred to as dense fluids. Unlike organic solvents, such as n-hexane or 1,1,1-trichloroethane, dense fluids exhibit unique physical and chemical properties such as low surface tension, low viscosity, and variable solute carrying capacity.

Cleaning with dense phase fluids is desirable, as such fluids retain the properties of a liquid, but have the diffusivity and viscosity of a gas. In addition, dense phase fluid cleaning technology can be applied in many industrial processes to significantly reduce or eliminate the use of hazardous chemicals, to conserve natural resources such as water, and to accomplish tasks previously not possible, such as rapid precision cleaning of small features of semiconductor devices (e.g., resist images, VLSI (Very Large Scale Integration) topographical features such as vias, etc.). Dense-phase fluids act as a solvent to remove contaminants from the wafer surface and effectively clean the surface of the substrate. Additionally, as required, the cleaning effectiveness of dense phase fluids is typically enhanced by the addition of chemical agents or co-solvents that react with materials used in semiconductor manufacturing.

However, typical modern dense-phase fluid cleaning systems and methods use high pressures, sometimes on the order of 4,000 psi or more, to generate and maintain dense-phase fluids used for cleaning. These high pressures typically require complicated and expensive pumping systems, as well as condenser systems for creating and maintaining the dense-phase state. Furthermore, these systems become more expensive as the process is scaled up, due to greater engineering and construction demands placed on the pumping systems and pressure vessels, as the size of the associated process machinery increases. Even further, these systems are inflexible because they require that all components to be cleaned are exposed to dense-phase fluids under the same pressure and temperature conditions, regardless of the individual cleaning requirements for each component. This often results in needless additional processing time and expense.

Therefore, what is needed is an inexpensive alternative to current dense-phase fluid cleaning systems.

SUMMARY OF THE INVENTION

According to one embodiment, there is provided a method for cleaning. A workpiece is introduced into a cleaning chamber containing a first dense-phase fluid at a first pressure, where the first pressure is maintained at less than about 1500 psi. The workpiece(s) are soaked in the first dense-phase fluid for a predetermined time period. During the soaking, the first dense fluid is optionally sonicated. A second, localized, high-pressure dense-phase fluid is applied to the surface of the workpieces.

In a preferred embodiment, the substrate is agitated. The agitation takes a number of different forms, including, but not limited to, brushing and vigorously applying the dense-phase fluid. In a more preferred embodiment, the first dense-phase fluid and the second dense-phase fluid are different from each other. The preferred first dense-phase fluid is $CO_2$. In one embodiment, the first dense-phase fluid will include a co-solvent. In another embodiment, the second dense-phase fluid also includes co-solvent, or even more preferably, is comprised almost entirely of co-solvent. When the second dense-phase fluid is comprised almost entirely of co-solvent, the co-solvent is often amphiphilic.

The second dense-phase fluid is preferably applied using the nozzle. The nozzle preferably has at least one orifice, and most preferably the orifice has a variable diameter. The nozzle is preferably configured to withstand internal pressure of approximately 4000 psi, so as to facilitate the application of high-pressure dense-phase fluid. Following completion of the cleaning cycle, the present method for cleaning further includes expelling said first and second dense-phase fluids from said cleaning chamber, at the completion of the cleaning cycle, and removing the workpieces from the cleaning chamber.

According to another embodiment, the method is preferably used to clean semiconductor substrates. This embodiment includes the steps of: (1) introducing at least one semiconductor substrate into a cleaning chamber; (2) introducing a first dense-phase cleaning fluid into the cleaning chamber; (3) controlling the temperature and pressure of the first dense-phase fluid using a temperature control device, with the pressure being maintained at substantially less than 1500 psi; (4) sonicating the first dense-phase fluid; (5) allowing the semiconductor substrate to remain immersed in the first dense-phase fluid for a predetermined time period; (6) applying a second, localized, high-pressure fluid near the surface of the semiconductor substrate; (7) expelling the first dense-phase fluid and the co-solvent from the cleaning chamber; and (8) removing the semiconductor substrate.

In a preferred embodiment, applying the second, localized high-pressure dense-phase fluid is accomplished by holding the nozzle at a predetermined distance from the semiconductor substrate during the application process. In an even more preferred embodiment, the second, localized, high-pressure fluid is substantially co-solvent. In another preferred embodiment, this co-solvent is amphiphilic.

According to another embodiment, a cleaning system has an inlet for receiving a first dense-phase fluid, and an outlet for expelling exhausted fluid. The cleaning chamber is configured and dimensioned to withstand internal pressures up to approximately 1500 psi. A nozzle is disposed within the cleaning chamber. The nozzle is configured and dimensioned for applying localized high pressure cleaning, using a second dense-phase fluid near the surface of a workpiece. The cleaning system preferably further includes an agitating device disposed within the cleaning chamber. The agitating device can take any number of different configurations, but two different embodiments use either brushes or high-pressure fluid. The cleaning system will typically, but not exclusively, include at least one ultrasonic transducer disposed within the cleaning chamber.

The nozzle of the cleaning system is configured to withstand internal pressures up to approximately 4000 psi. The nozzle will preferably be configured with at least one orifice having variable diameter. The cleaning system further includes a temperature-control device. The cleaning system will preferably further include a co-solvent inlet.

According to another embodiment, there is provided a system for removing resist and etching residue from semiconductor substrates. The system has a cleaning chamber with an inlet for receiving dense phase fluid and an outlet for expelling exhausted fluid. The cleaning chamber is configured to withstand internal pressures up to approximately 1500 psi. The nozzle for directing dense phase fluids onto the surface of substrates is configured for the localized high-pressure application of dense-phase fluid onto the substrate(s). The system further includes at least one ultrasonic transducer. The system further includes a nozzle configured with at least one orifice of variable size.

Accordingly, the invention addresses the need to provide methods for cleaning using high-pressure dense-phase in a low-cost, medium-pressure system.

BRIEF DESCRIPTION OF THE DRAWINGS

FIG. 5 is a process flow diagram of a cleaning process, according to an embodiment of the present invention.

DESCRIPTION OF THE PREFERRED EMBODIMENT

Figure 1:
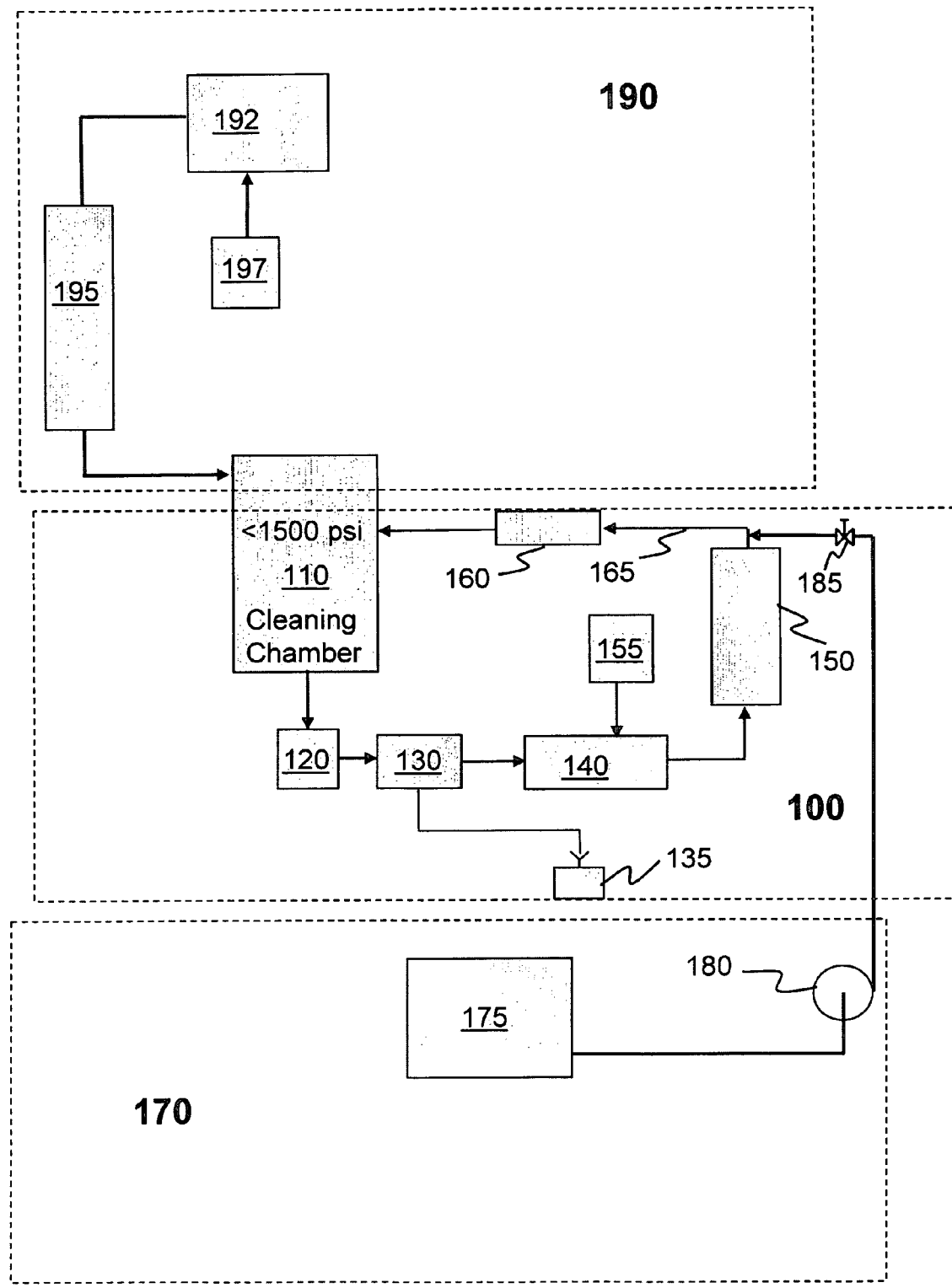
FIG. 1 is a block diagram of a dense-phase fluid cleaning system according to an embodiment of the invention.

FIG. 1 is a block diagram of a dense-phase fluid cleaning system 100 according to an embodiment of the invention. The system 100 is preferably used for cleaning semiconductor substrates. However, it should be appreciated by one skilled in the art that the system 100 can be used for any number of other types of workpieces. Throughout this patent, the terms substrate and workpiece will be used interchangeably, and the present invention should not be viewed as limited to semiconductor substrates. In a preferred embodiment, more than one substrate can be cleaned at a time by the system 100.

The system 100 preferably includes a cleaning chamber 110 operating at a pressure of less than 1500 psi, a system for purifying used dense-phase cleaning fluid, a system for compressing the used dense-phase fluid to provide adequate pressure to achieve the phase desired, and a temperature control apparatus for adjusting the temperature of the fluid entering the cleaning chamber. In a preferred embodiment, the system further includes a separate dense-phase fluid handling system 190 for use with a localized cleaning apparatus, and a separate co-solvent introduction system 170 with pump for adding additional co-solvents to the system.

More specifically, the dense-phase fluid cleaning system 100 preferably includes a cleaning chamber 110 in which dense-phase fluid is used to clean a substrate (not shown). The types of dense-phase fluid employed in this device are limited only by the design pressure embodied in the invention. The cleaning chamber 110 in this invention is purposely designed to withstand lower pressures than are typically employed in systems intended to be used for supercritical fluid cleaning across a broad range of solvent species. Generally, the pressure in the cleaning chambers during cleaning is in the mid-pressure range, which is between atmospheric pressure and 1500 psi. More preferably, the pressure in the cleaning chambers is between 400-1500 psi. The mid-pressure design of the present invention will generally, but not exclusively, mean that the chamber will be used for cleaning substrates with dense-phase fluids at a pressure and temperature different than that required for the creation of a supercritical state, i.e., supercritical fluids are typically formed at pressures higher than the 1500 psi operating pressure of the cleaning chamber 110. The mid-pressure design of the present invention results in significant cost savings due to reduced material costs from the elimination of many pumps and condensers frequently used in supercritical fluid cleaning systems, as well as through the use of thinner, less expensive construction materials.

The cleaning chamber 110 of the present invention is preferably constructed of stainless steel, although other types of materials, such as aluminum or composite materials, may be used due to the relatively lower operating pressure associated with this system. It should be appreciated that the use of these materials, versus stainless steel, may result in even further cost savings as the raw material cost may be lower. Even if the cleaning chamber is constructed of stainless steel, however, the required wall thickness is thinner than systems where the operating pressure is higher. This results in a lower cost due to lower material costs. The wall thickness is dependent on the chamber size, and thus, will vary from system to system. The chamber 110 further has a door through which the substrate(s) are inserted prior to charging the system with dense-phase cleaning fluid. The substrates may either be inserted manually, such as by an operator, or mechanically, through robotic or similar devices. If a robotic or similar device is employed for workpiece transfer, the system preferably further includes a load lock device (not shown) which facilitates the transfer of workpieces from a different processing chamber, typically at a lower pressure, to the higher pressure environment of the cleaning chamber. A load lock generally is desirable when the cleaning chamber is one part of a larger, continuously operating workpiece processing line, for instance. Inclusion of a load lock generally increases process cycle efficiency by reducing the time required to pressurize the cleaning chamber.

In addition, the system preferably includes a dense-phase fluid purification system. An outlet of the cleaning chamber 110 is preferably attached to a particulate filter 120. The filter 120 is used for first-stage filtration of relatively large particles, on the order of 10 to 100 microns, from the used dense-phase cleaning fluid as it is exhausted from the cleaning chamber 110 at the end of a cleaning cycle. A separator 130 is coupled to the particulate filter 120. The separator 130 is used to remove liquid organic contaminants from the dense-phase cleaning fluid. The effluent from the separator 130 is generally comprised of two phases, a purified dense-phase liquid, and a waste liquid phase. The purified dense-phase liquid flows out of the separator 130 and continues on in the cycle. The liquid waste is directed from the separator 130 to a separate drain line, which drains into a waste storage container 135. The waste container 135 is drained as necessary by the operator into a separate container (not shown) for permanent disposal.

The dense-phase fluid cleaning system also preferably includes a fluid compression and storage system. The purified liquid phase preferably flows from the separator 130 into a compressor 140. The compressor pumps the purified liquid into the mid-pressure storage vessel 150. Preferably, the compressor 140 pumps the purified fluid into the mid-pressure storage reservoir 150 under sufficiently high pressure to ensure that the purified fluid will change phase into a dense-phase fluid. The storage vessel 150 stores the purified, compressed dense-phase fluid for use in the next cleaning cycle. The compressor 140 must also provide adequate pressure to the mid-pressure storage vessel 150 to cause flow from the storage vessel 150 into the cleaning chamber 110 when a new cleaning cycle begins. Finally, the storage vessel 150 preferably is attached to an external source 155 of the dense-phase fluid being used for the process so that any fluid lost during the cleaning process is replaced, as necessary. As with the cleaning chamber 110, all components of the dense-phase fluid cleaning system are designed to withstand pressure less than about 1500 psi.

Also, the system preferably includes a temperature control device 160 in the dense-phase fluid cleaning system 100. The temperature-control device 160 is used to adjust the temperature of the incoming dense-phase fluid to ensure that fluid has the desired properties for the desired cleaning process performed in the cleaning chamber 110.

Furthermore, the system preferably includes a co-solvent introduction system 170 comprised of a co-solvent storage device 175 and a pump 180 for introducing co-solvent into a cleaning chamber 110 feedline 165. The co-solvent is typically added into the feedline 165 to ensure that the co-solvent is uniformly dispersed throughout the dense-phase liquid before entering the cleaning chamber 110. The co-solvent is typically a liquid, and may be any of a number co-solvents known in the art, including, but not limited to, methanol, ethanol, ethyl acetate, tetrahydrofuran, other alcohols, liquid alkanes, methylene chloride, chloroform, toluene, water, ketones, and esters, hydroxylamine, and dimethyl sulfoxide or DMSO. The choice of co-solvent(s) is dependent on the nature of the contaminant to removed, and is within the knowledge of one skilled in the art.

Finally, the system optionally, but preferably, includes a separate dense-phase fluid system 190 for creating localized supercritical fluid conditions in the cleaning chamber 110. The separate dense-phase system 190 comprises the machinery necessary to generate supercritical fluids, including a compressor 192 and a high-pressure storage unit 195. The high-pressure storage unit 195 of the separate dense-phase fluid system 190 is able to withstand pressures up to about 5000 psi. The system 190 further includes a dense-phase fluid supply 197 for initially charging the high-pressure storage unit 195 and for making up for any dense-phase fluid lost during a cleaning process. The system 190 optionally includes a co-solvent introduction system (not shown) similar to that of the dense phase fluid cleaning system 170.

Figure 2:
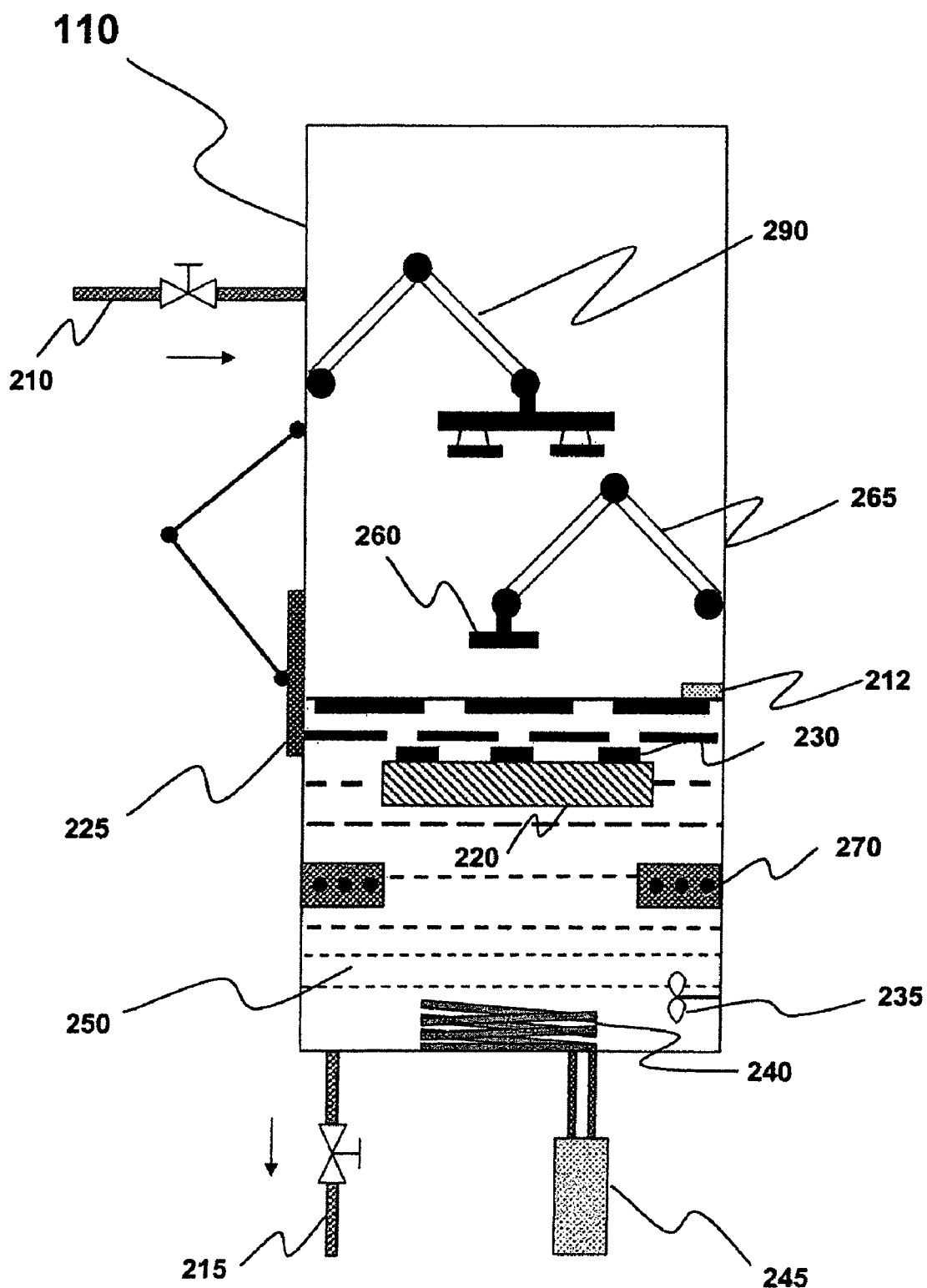
FIG. 2 is a cross-sectional view of a cleaning chamber according to an embodiment of the present invention.

FIG. 2 is a cross-sectional view of the cleaning chamber 110 shown in FIG. 1. The cleaning chamber 110 is preferably used for cleaning semiconductor substrates. However, it should be appreciated by one skilled in the art that the system can be used for any number of different types of workpieces, and should not be construed as being limited to semiconductor applications. In a preferred embodiment, more than one substrate is cleaned at a time in the cleaning chamber 110.

The substrate(s) 230, which are introduced into the cleaning chamber 110 through an access door 225, are held on a rack 220. This rack 220 is positioned anywhere inside of the chamber 110, but in this embodiment the rack 220 is placed near the center point of the chamber 110. Preferably, the rack 220 is fully translatable though the cleaning chamber 110, so that the rack 220 may be positioned at different locations within the cleaning chamber, depending on the application, or may even be moved during processing. The substrates 230 are preferably held on the rack 220 by any suitable means, such as vacuum chucks, or mechanical clamp assemblies. The size and number of substrates 230 held inside of the chamber will vary with each embodiment. However, in a preferred embodiment, the system will hold between 1-50 substrates.

In use, the cleaning chamber 110 is filled with dense-phase fluid 250. The dense-phase fluid 250 preferably enters the cleaning chamber 110 thorough an inlet valve 210. The level of the dense phase fluid 250 is preferably set to a predetermined value, as measured by a fluid level measuring device 212 that is coupled to a mechanical or electrical gauge (not shown), so that the operator may remotely determine the dense-phase fluid 250 level. The dense-phase fluid is preferably agitated as needed, e.g., to maintain a solution of co-solvent in dense-phase fluid, or to facilitate cleaning, for instance, using the mixing device 235. The dense phase fluid 250 is preferably drained from the cleaning chamber 110 through the outlet valve 215.

The cleaning chamber 110 preferably further contains a temperature control device 240, such as cooling or heating coils. The temperature control device 240 is used to control the temperature of the dense-phase fluid 250 inside of the chamber. The temperature control device 240 either decreases or increases the temperature of the cleaning fluid 250, to maintain the dense phase fluid 250 at the desired pressure and temperature. For example, if a liquid-phase solvent is desired, it may be necessary to cool the dense-phase fluid entering the system, if the dense-phase fluid is at a relatively low pressure. The temperature control devices 240 are known to the art, and include circulating liquid coolant and thermoelectric cooling. If circulating liquid coolant is used, the liquid is cooled through the use of a chiller 245 or other device known in the art. On the other hand, it may sometimes be advantageous to increase the temperature of the dense-phase fluid 250. This will allow the operator to increase the pressure of the vessel, which often results in an increase in solvent strength for a given dense-phase fluid 250. As before, such a temperature control device 240 is known in the art, and includes resistive heating elements and circulating heat fluid devices. Depending on the mode of temperature control chosen, the temperature control device 240 is one or more units. Regardless of the mode chosen, however, the temperature control device 240 is electrically coupled to a controller (not shown), which is also connected to a temperature measurement device and to a computer control unit (not shown). By comparing the measured temperature of the dense-phase fluid 250 to the setpoint in the programmed computer instruction set, the controller can adjust the temperature control device 240 to maintain the temperature, and thus the phase, of the dense-phase fluid 250 and solvent in the cleaning chamber, relative to the chamber pressure. Note that the temperature control device 240, as illustrated, is internal to the cleaning chamber 110. However, the temperature control device 240 may also be external to the cleaning chamber 110, in an external jacket assembly, for instance. Therefore, the embodiment shown is for illustration only, and should not be construed as limiting the present invention to internal temperature control devices 240.

The cleaning chamber 110 also optionally comprises a workpiece surface mechanical agitation device 290. This device may be of brushes, or other similar types of devices. This agitation device 290 is used during the cleaning cycle, to aid in the mechanical removal of surface contamination or debris. The mechanical agitation device 290 may be used during pre-cleaning, to remove loose (non-chemically bonded) contamination, or may be used during dense-phase fluid cleaning, to improve the efficiency of the chemical clean. Use of the mechanical agitation device either during pre-cleaning or during the dense-phase fluid cleaning will generally decrease the cleaning cycle time, as well as improve the quality of the cleaning obtained.

The cleaning chamber 110 also preferably comprises one or more ultrasonic transducer(s) 270. The ultrasonic transducer(s) are preferably used to create localized ultrasonic cavitation within the solvent. This ultrasonic cavitation preferably produces bubbles which subsequently burst, creating sufficient force within the dense phase gas to promote the removal of contaminants from the surface of the substrate. The ultrasonic transducer(s) preferably operates, at a range of frequencies, from 1 to 100 MHz. The ultrasonic transducer(s) may be operated at a single frequency, or may be repetitively swept through a range of frequencies to further aid in contaminant removal.

The cleaning chamber 110 will also preferably include a nozzle 260 which can be used to directionally apply dense-phase cleaning fluid 250 to the substrate(s) 230 to be cleaned. The nozzle 260 will preferably, but not necessarily, have a separate high-pressure dense-phase fluid supply 190 (FIG. 1) from the dense-phase fluid supply used for the cleaning chamber 110. If there is no separate high-pressure dense-phase fluid supply 190, the nozzle 260 may be supplied with dense-phase fluid from the main feed line 165 (FIG. 1). In this configuration, the system will optionally include a separate high-pressure pump (not shown), to generate the localized high-pressure dense-phase fluid 250 to the nozzle 260. The nozzle 260 may also optionally include a separate co-solvent introduction system (not shown). The nozzle 260 of this invention is designed such that it may apply high-pressure dense-phase fluids in a localized manner. Thus, while the cleaning system 100 (FIG. 1) as a whole may not typically be used to generate the pressures necessary to effect high-pressure dense-phase cleaning, the nozzle 260 is used to provide the benefits of cleaning using high-pressure dense-phase fluids at localized areas of the substrate 230. The nozzle 260 is preferably movable, so that dense-phase fluid is applied to one or more substrates 230 at a time, or can be used to repetitively clean certain areas of the substrate 230, if necessary. Directional control of the nozzle 260 is either electronic, through the use of a remote control unit (not shown) linked to robotic arms 265, or it is manual, through the use of a mechanical interface to the nozzle 260, which is controlled directly by an operator from the exterior of the cleaning chamber 110.

Alternatively, the nozzles 260 are stationary. In this embodiment, it is preferable to have more than one nozzle, so as to more efficiently clean the workpieces. The nozzles 260 are located in close proximity to the workpieces 230 so that sufficient pressure build-up can occur. In yet another alternative embodiment, there is a single nozzle 260 in an elongated configuration (not shown). The rack 220 may then be rotated below the nozzle 260 to allow the various workpieces 230 to be exposed to the supercritical fluid from the nozzle 260. Alternatively, the elongate single nozzle 260 is rotated and the rack 220 remains stationary.

Figure 3A:
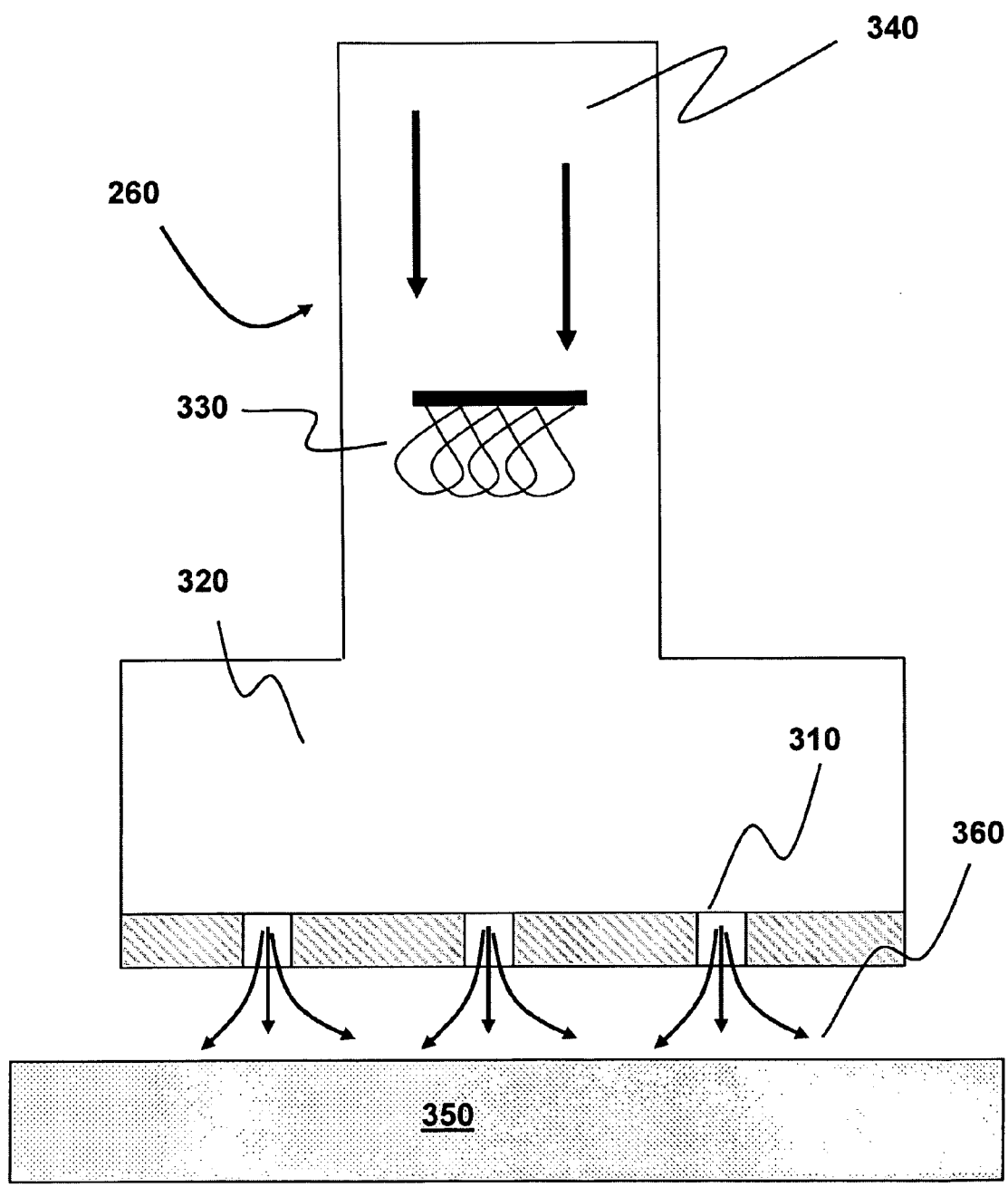
FIG. 3A is a cross-sectional view of a nozzle according to an embodiment of the present invention.

FIG. 3A shows a cross-sectional view of one embodiment of the nozzle 260 of the invention. The nozzle 260 has at least one orifice 310, but preferably a plurality of orifices 310. The nozzle 260 of the invention preferably has a separate dense-phase fluid handling system (not shown). This system is preferably comprised of a compressor, a high-pressure fluid storage system, and a heater. Similar to the cleaning system 100 (FIG. 1) of the present invention, no condenser or fluid pump is necessary in the nozzle 260 system to create a localized high-pressure dense-phase fluid. Instead, high pressure, along with temperature control inside of the nozzle 260 is used. However, in certain applications, it may be desirable for the system to include either a condenser or a fluid pump, or both. The presence or absence of a pump or condenser is not critical to the present invention, and as such, the exclusion of these components in this embodiment should not be viewed as limiting. Because the nozzle 260 will be used to generate high-pressure dense-phase fluids, this system is preferably constructed to withstand higher pressures than the cleaning chamber 110 (FIG. 2) can withstand. The system is preferably able to attain pressures adequate to create localized supercritical fluids at the surface of a substrate 250. It is preferable that the nozzle and its associated fluid handling system have an operating range of between 100 and 4,000 psi.

The system is able to generate a localized high pressure in the region 360 between the orifice 310 and the workpiece 350 capable of sustaining supercritical conditions, when using pure $CO_2$ as the dense-phase gas. The pressure attainable is a function of the interior pressure of the nozzle 260, the distance between the workpiece 350 and the orifice 310, and the orifice 310 diameter. More precisely, the pressure attainable will vary directly with interior pressure of the nozzle 260 and the distance between the workpiece 350 and the nozzle 260, and will have an inverse relationship with orifice 310 diameter. The inverse relationship with orifice 310 diameter is a result of two different phenomena associated with developing high pressure in a limited region 360. First, pressure drops off sharply with distance with a very small orifice 310. Therefore, to maintain the proper high pressure the nozzle 260 would have to be close to the workpiece 350. However, there must be adequate clearance between the workpiece 350 and the nozzle 260 to provide tolerance for error in positioning of the nozzle 260 by the robotic arms 265 (FIG. 2) or the workpieces 350 on the rack 220 (FIG. 2). Therefore, this constraint provides a lower limit to orifice 310 size. Conversely, too large of an orifice 310 results in a high flow rate through the nozzle 260. It is difficult for a dense-phase fluid handling system to maintain the required high pressure in the nozzle interior portion 320 while concurrently providing high flow rates. Therefore, the maximum flow rate capability of the system will typically provide an upper boundary to orifice 310 size. Preferably, the various parameters discussed above are chosen to provide a pressure in the region 360 between the orifice 310 and the surface of the workpiece 350 of between about 1500 and about 4000 psi.

The nozzle 260 preferably includes a body having an interior portion 320 which includes a temperature control device 330, typically comprising a heating element, for generating supercritical fluid at the outlet of the orifice 310 by suitable temperature regulation of the cleaning fluid. The high-pressure dense-phase fluid will typically cool upon expansion through the orifice 310, and as such heating of the dense-phase fluid may be necessary to maintain the correct phase during expansion.

Figure 3B:
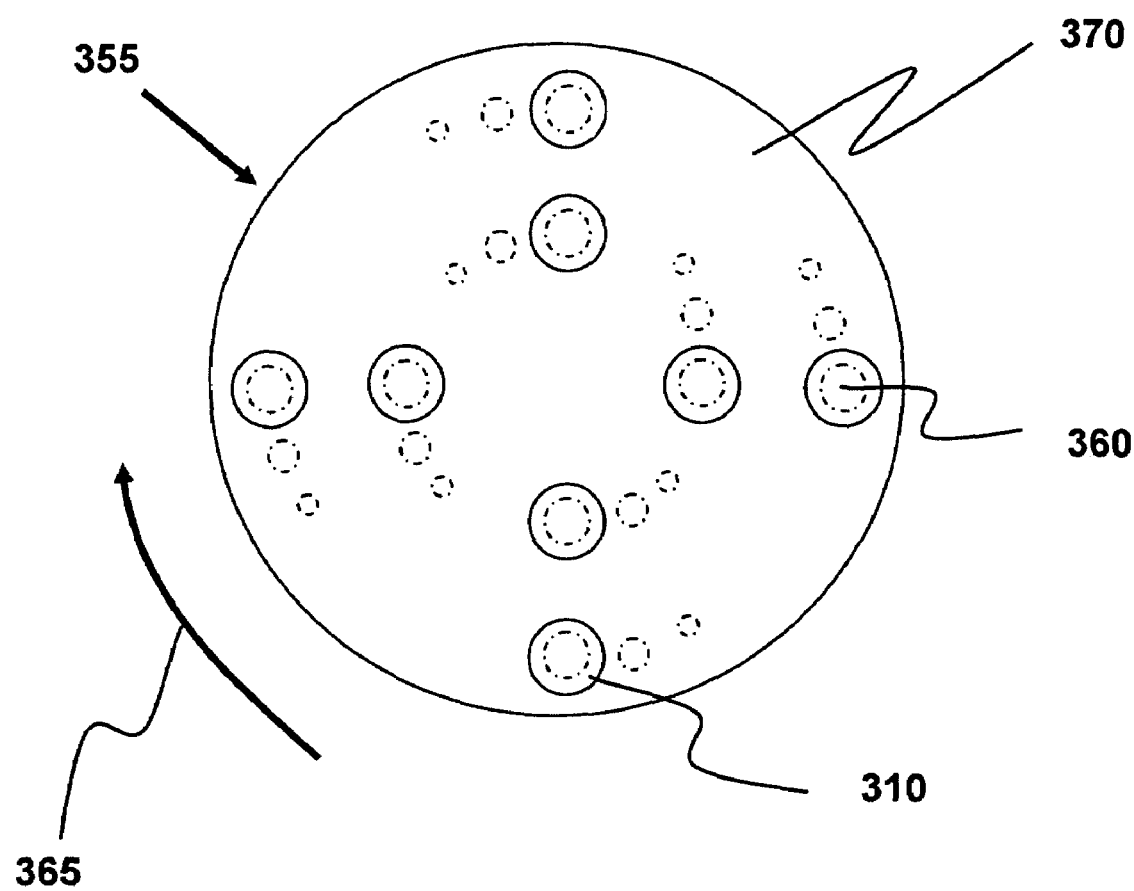
FIG. 3B is a top view of an adjustable nozzle orifice according to an embodiment of the present invention.

The nozzle 260 head may have a number of shapes, depending on the cleaning application desired. The nozzle head may be round, square, or rectangular, for example. Similarly, the arrangement of the orifices in the nozzle may have a number of different configurations. FIG. 3B shows a bottom view of an example of one nozzle head 355 and orifice 310 arrangement. The diameter of the orifice 310 of the nozzle is adjustable, to allow for the modification of the process due to, for instance, the nature of the dense-phase fluid used, the type of workpieces 350 cleaned, or differences in working distance between the nozzle 260 and the workpiece 350. The orifice 310 is preferably adjustable remotely, through the use of an external controller (not shown) electronically coupled to a movable orifice plate 370 with orifice restriction holes 360 drilled into it. The movable orifice plate 370 may be coupled to an electric motor (not shown) through appropriate gears to drive movable plate 370. In FIG. 3B, for example, movement of the orifice plate 370 in the direction indicated by the arrow 365 would result in a smaller effective orifice 310 as the orifice restriction hole 360 lines up with the orifice 310. Alternatively, the orifice is a plate with a single-size hole or holes drilled in it, which is then inserted into the nozzle manually by the operator. In yet another embodiment, an orifice plate 370 with multiple orifice restriction holes 360, is turned manually. These alternatives would require taking the system offline, however, which may result in slower processing cycles.

Figure 3C:
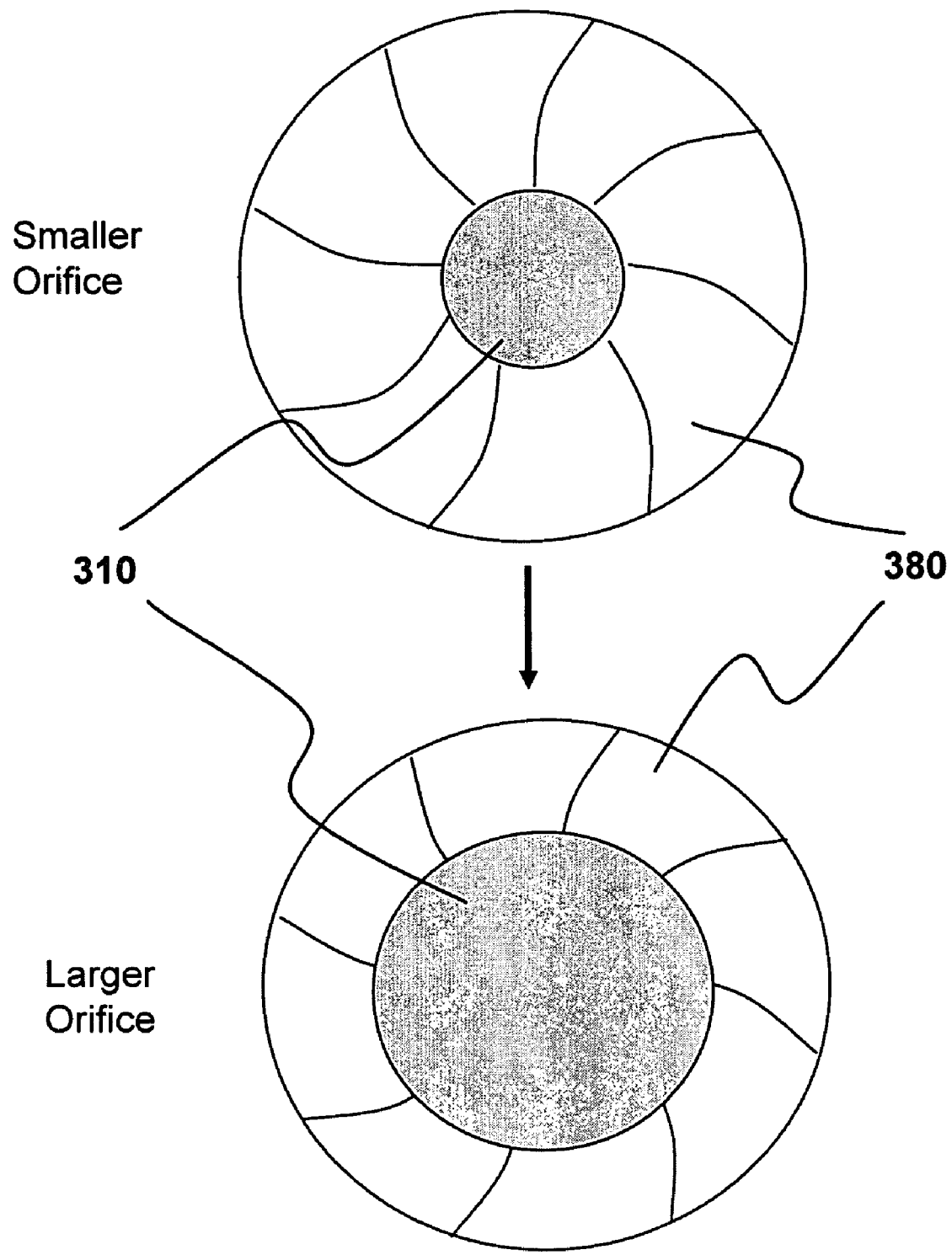
FIG. 3C is a bottom view of an adjustable nozzle orifice according to an embodiment of the present invention.

In FIG. 3C, a bottom view of a third nozzle 260 embodiment is shown. In this embodiment, the orifice 310 is adjustable. The orifice 310 is surrounded by segmented plates 380. The segmented plates 380 are rotatively coupled to a drive mechanism (not shown). The segmented plates 380 may be moved inward and outward, relative to the orifice 310, so as to increase or decrease the orifice size. This embodiment is advantageous because it allows the orifice size to have a greater variability than either of the embodiments in FIG. 3A or 3B. This allows greater flexibility in setting a working distance between the nozzle and the workpiece. In addition, the nozzle of the present invention may include one or more orifices of the type shown in FIG. 3C.

Figure 4:
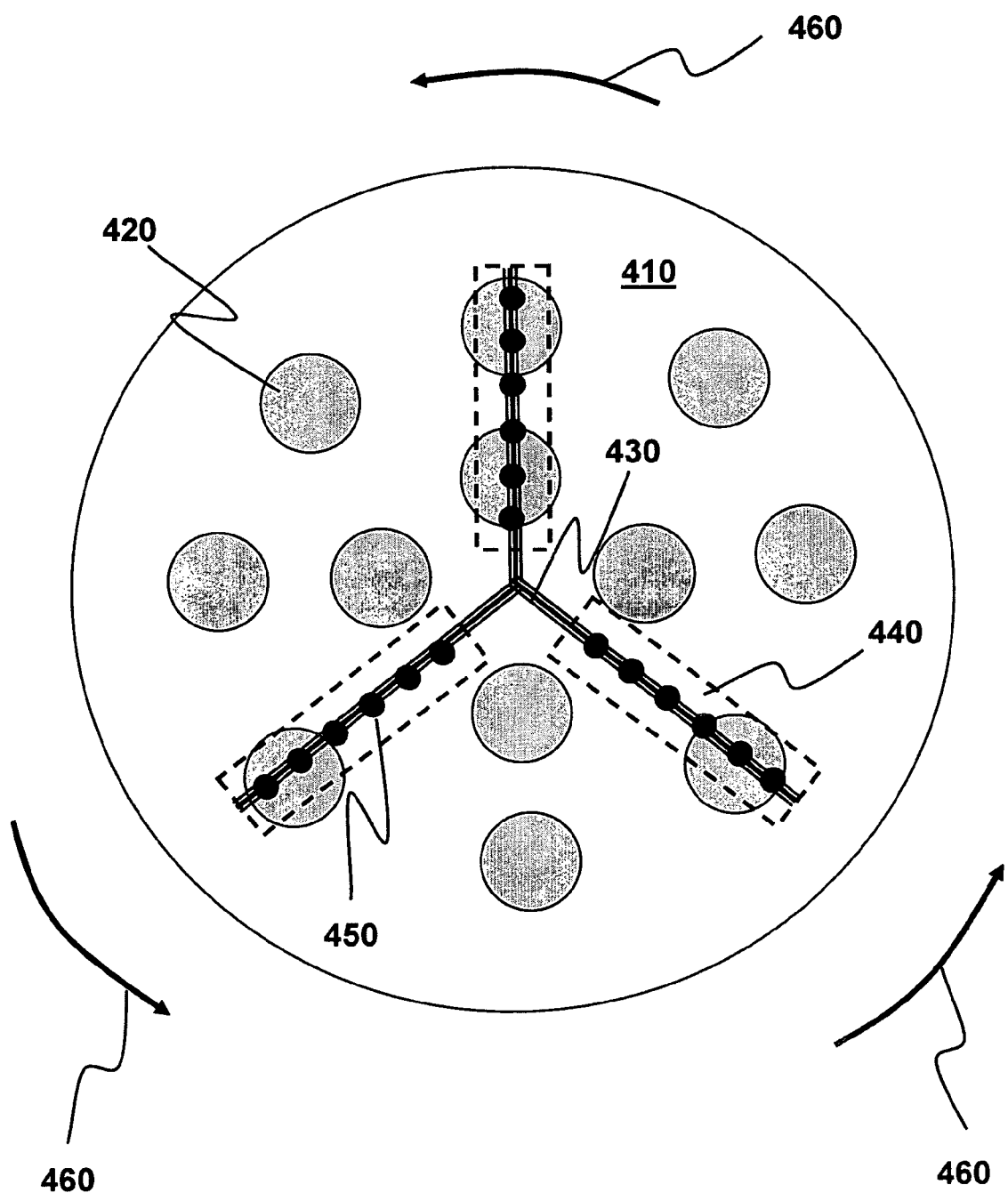
FIG. 4 is a top view of a cleaning chamber comprising an agitating device combined with spray nozzles, according to another embodiment of the present invention.

FIG. 4 is a cross sectional top view of a cleaning chamber 410 comprising an agitating device, in the form of brushes 440, combined with nozzles 450, according to another embodiment of the present invention. The brushes 440 and the nozzles 450 are mounted on an arm assembly 430. Preferably, the arm assembly 430 is mounted on a rotatable mount (not shown). The workpieces 420 are mounted on a rack 410, as described above in relation to FIG. 2. The arm 430 assembly rotates in the direction shown by arrows 460, for instance, and applies high-pressure dense-phase gas to the workpieces 420 concurrent with agitation of the workpiece 420 surface. This embodiment provides increased cleaning efficiency. Surface contamination initially removed by the high-pressure dense phase fluid, or high-pressure dense-phase fluid/co-solvent combination, is immediately swept off of the surface of the workpiece 420 before it has an opportunity to settle onto the surface. This reduces the possibility of re-contamination of the workpiece 420 surface. The present invention also provides the additional advantage of reduced processing cycle time, by virtue of having combined two process steps into one, i.e., a high-pressure cleaning step and an agitation step. It should be obvious to one of skill in the art that identical benefits to those shown by this embodiment could be provided using similar means, such as rotating the rack 410 rather than the arm 430 assembly, and the embodiments illustrated should not be construed as disclaiming such, or similar, embodiments.

FIG. 5 is a flow chart of a process for cleaning a substrate according to the present invention. The substrate to be cleaned is placed into the cleaning chamber 110 (FIG. 2) through door 225 (FIG. 2). At step 500, the chamber is sealed, and dense-phase fluid, in the form of $CO_2$ in this example, is allowed to enter the chamber 110 through the inlet valve 210 (FIG. 2). As pressure builds in the cleaning chamber due to the introduction of high-pressure dense-phase gas, $CO_2$ is condensed as a liquid. This is a function of both the increase in pressure of the cleaning tank and through use of the temperature-control device 140 in the vessel 100 to cool the liquid 250 (FIG. 2). The liquid 250 is below the critical point for $CO_2$ (32° C.; 72.9 atmospheres), which is defined by pressure and temperature. In a preferred embodiment, the maximum pressure contemplated by this process is about 1,500 psi (105.5 kg/cm$^2$), at ambient temperature (25° C). In addition, any co-solvents required are added to the cleaning chamber feed line 165 (FIG. 1) through the co-solvent inlet valve 185 (FIG. 1). Typically, the co-solvents will be fully miscible in the dense-phase liquid, and a single phase will be formed. The mixing device 235 (FIG. 2) is used to facilitate mixing of co-solvent into the dense-phase liquid. However, in some embodiments it is desirable to choose a co-solvent that is not miscible with the dense-phase liquid. In this case, a second liquid layer is formed in the cleaning chamber, either below or on top of the dense-phase fluid layer, depending on the relative densities of the two materials. Alternatively, if the two materials do not form a separate layers, an emulsion may form instead. The availability of a second, non-miscible, co-solvent layer or emulsion may provide additional cleaning advantages, as will be discussed further below at step 530.

Next, at step 510, after charging the cleaning chamber with dense-phase gas, the temperature is adjusted as required to maintain the liquid state, for example 25° C., at 800 psi (56.2 kg/cm$^2$). The dense-phase fluid level is adjusted from the mid-pressure reservoir 150 (FIG. 1) as required to immerse substrates 230 (FIG. 2). The dense-phase fluid level is measured by means of level indicator 212 (FIG. 2) in vessel 110 (FIG. 2).

The workpieces are then cleaned at step 520. In a preferred embodiment, the dense-phase liquid 250 (FIG. 2) is heated using the heating coils 240 (FIG. 2) to a temperature of approximately 32° C. As the dense-phase fluid is heated, the solvent strength of the dense-phase fluid will increase. To maintain the correct phase, it is typically necessary to increase the cleaning chamber pressure as well. At step 522, the parts are typically soaked in the dense-phase fluid for a period of 1-30 minutes. As necessary, the temperature and pressure conditions within the cleaning chamber 110 are cycled to further increase the cleaning efficacy of the soak 522 process. The temperature of the dense-phase fluid is cycled between 30-35° C. at 1000-1100 psi, for example.

Next, at step 524, sonication is preferably performed on the liquid and the submerged substrates. The ultrasonic transducers 270 (FIG. 2) are preferably operated at a frequency ranging from about 5 to 100 Kilohertz, and either swept through this range and held constant at one particular frequency. The sonication process may last from a period of 0.1 to 10 minutes, and preferably between 0.5 to 2 minutes. However, as should be appreciated by one skilled in the art, the sonication time will vary from application to application. Also, it should be further appreciated that the order in which the soaking and sonication steps appear should not be viewed as limiting the order in which these steps may be performed. That is, the order may be as disclosed or, in a preferred embodiment, soaking and sonication occur concurrently.

At step 526, an optional agitation step is performed, such as by using a mechanical brushing device to brush the surface of the substrate. Alternatively, some other type of agitation is performed, such as by vibrating, rotating, or otherwise moving the rack 220 (FIG. 2) on which the substrates are mounted. The agitating rack may either contact a mechanical brushing device which is stationary, or is agitated while submerged in dense-phase fluid, without contacting a mechanical brushing device. Another form of agitation may include agitating the dense-phase fluid, by stirring with an impeller or a jet, for example. Agitation helps to loosen particles from the surface of the substrate that may not be removed otherwise.

Optionally, if the co-solvent added at step 500 was not miscible with the dense-phase fluid, the layer of co-solvent formed either on top of or underneath the dense-phase liquid layer is used for an additional cleaning or rinse step, for instance. In this case, the translatable rack 220 (FIG. 2) would be either moved up or down, depending on where the separate liquid co-solvent phase is located relative to the dense-phase liquid layer. The substrates 230 would be exposed to the co-solvent for a pre-determined period of time, before proceeding on to step 540.

Often, the mid-pressure cleaning process will adequately clean the substrates. However, in another embodiment, a higher-pressure cleaning process 530 is necessary, to more fully remove photoresist residues, for example.

At step 532, which is optional, the nozzle is used to locally apply high pressure dense-phase fluid to the surface of the substrate. It should be recognized that the dense-phase fluid 250 (FIG. 2) in the cleaning chamber 110 (FIG. 2) is not under high pressure. Only the fluid in the vicinity of the nozzle 260 (FIG. 2) is at high pressure. This provides a significant advantage of the invention. While the nozzle 260 is constructed of materials of sufficient structural strength and complexity to generate high-pressure dense phase fluids, and if necessary, supercritical fluids, the cleaning chamber 110 is not so constrained. Therefore, because the nozzle 260 assembly is smaller, any machinery required to generate high-pressure dense-phase fluids will also be smaller, less complex, and hence less expensive. Therefore, the present invention provides the benefits of high pressure dense-phase fluid cleaning in localized areas at a lower cost than prior art devices using condensers and fluid pumps, which is a significant advantage over such devices.

Use of high-pressure dense-phase fluid provides a number of advantages over mid-pressure cleaning alone. One obvious advantage is that provided by the increased solubility of many solutes in the higher-pressure dense-phase fluid. However, not all of the advantages are due to improved solubility. Forcing dense-phase fluid out of the nozzles under high pressure causes the dense-phase fluid to flow out of the nozzle 260 at a high velocity. When the dense-phase fluid impinges on the substrate surface 350 (FIG. 3), a mechanical shear force against the surface 350 results. This allows surface contamination or debris to be physically removed regardless of whether or not the contamination or debris is chemically soluble in the dense-phase fluid. It should be recognized that when high-pressure dense-phase fluid is used to remove surface contamination or debris in this manner it represents another form of agitation of the substrate surface.

Another advantage of using high-pressure dense-phase fluid for localized cleaning is realized when the workpiece cleaned is a semiconductor substrate containing vias. Vias are small pathways between layers of a semiconductor device which, when filled with conductive material, connect the two layers electrically. During the manufacturing process, however, and before the pathways are filled with conductive material, vias will often be filled with debris resulting from the creation of the via, or some other processing step. These vias must be cleaned of debris prior to depositing the conductive materials into the via. Applying high-pressure dense-phase fluid to a substrate containing vias results in the fluid being forced into the via. As the nozzle 260 passes over the via, the high pressure condition in the via is relieved by the fluid being ejected from the via. This action results in a "pumping" action, in which residue or debris is physically removed from the via, again regardless of whether or not the debris is chemically soluble in the dense-phase fluid.

Optionally, the nozzle and/or the workpiece rack is rotated during step 532 to provide additional mechanical shear force to the surface of the substrate.

In a preferred embodiment, co-solvent may be applied during the high-pressure cleaning step 532. The co-solvent may comprise any percentage of the high-pressure dense-phase fluid applied to the workpieces, up to and including 100% of the high-pressure fluid. It should be obvious to one in the art that, strictly speaking, when the high-pressure fluid applied to workpieces is comprised of 100% co-solvent, the fluid may no longer be called a dense-phase fluid. High-pressure application of a fluid comprised primarily, or even exclusively, of co-solvent provides significantly different solvent properties than those obtained by the use of dense-phase solvent alone, either at mid or high-pressures, and is a significant advantage of this invention.

Use of co-solvent or 100% co-solvent during the high pressure wash is performed in one of two ways. First is when the co-solvent is miscible in the dense-phase fluid in the cleaning chamber 110. In this situation, after impacting and washing the surface of the substrates, the used co-solvent will mix with the dense-phase fluid in the cleaning chamber 110. Co-solvents appropriate for use with $CO_2$-based dense-phase cleaning systems include, but are not limited to, methanol, ethanol, ethyl acetate, tetrahydrofliran, other alcohols, liquid alkanes, methylene chloride, chloroform, toluene, water, ketones, esters, hydroxylamine, and dimethyl sulfoxide or DMSO. The resulting mixture formed in the cleaning chamber 110 has properties similar to that of a dense-phase fluid/co-solvent mixture formed during a mid-pressure clean process 520.

Second, co-solvent that is not miscible may be used in the high pressure clean. This provides an additional advantage to the present invention. The high-pressure co-solvent drains into the cleaning chamber 110. Rather than forming a mixture, the co-solvent forms an emulsion or suspension in the dense-phase fluid. Suspensions of co-solvent in dense-phase fluid have an improved cleaning capability for certain substrates 230. Examples of co-solvents useful for this embodiment should have the property of being amphiphilic, i.e., possessing two endgroups, each with affinities for different polarities of material. For instance, in an embodiment, the amphiphilic species should have one endgroup that has an affinity for the dense-phase fluid, and one endgroup that has a greater affinity for the material to be removed from the substrate, similar to surfactants used in detergent solutions, for instance. The amphiphilic co-solvent is applied to the substrate 230 and solubilizes the material to be removed. The contaminated co-solvent settles in the cleaning chamber, and forms an emulsion in the dense-phase fluid. The contaminated dense-phase fluid can then be purified in the normal manner after draining the cleaning chamber 110, as discussed at step 550 below. Properties of amphiphilic species used in the present invention, as well as some exemplary chemical species, are discussed in U.S. Pat. Nos. 5,944,995 and 6,224,774 to DeSimone, et al., both of which are incorporated herein by reference.

At step 534, an optional agitation step is performed, using a mechanical brushing device 290 to brush the surface of the substrate. Alternatively, some other type of agitation is performed, such as by rotating or otherwise moving the rack 220 (FIG. 2) on which the substrates are mounted. The agitating rack may either contact a mechanical brushing device 290 which is stationary, or is agitated while submerged in dense-phase fluid, without contacting a mechanical brushing device. Agitation aids in loosening particles from the surface of the substrate that may not be removed otherwise. If the brushing device is of a design similar to FIG. 4, the high-pressure dense-phase fluid clean 532 may done simultaneously with agitation 534, or may be done serially.

At step 540, following cleaning, the contaminated fluid is removed from the cleaning vessel. Note that step 540 is performed in a batch-wise manner, with the chamber being charged, then fully emptied, or it is done continuously, whereby the dense-phase fluid is allowed to flow through the system in a dynamic manner. For the purposes of this discussion, the batch-wise process will be discussed. However, the comments made in relation to the batch-wise process will also generally apply to the continuous process as well, and should not be perceived as limiting.

Next, at step 550, the used dense-phase fluid is purified and recycled. The fluid is drained from the cleaning chamber 110 (FIG. 1) and passes through a first-stage filter 120 (FIG. 1). First-stage filter 120 is used to remove relatively large particulate, on the order of 10 to 100 microns. After first-stage filtration, the dense-phase fluid passes through the separator 130 (FIG. 1), wherein liquid organic contamination and co-solvent, if present, is separated out. The organic liquid contaminant is routed to waste 135 (FIG. 1) and the purified dense-phase fluid continues through the cycle.

Next, at step 560, the compressor 140 (FIG. 1) fills and pressurizes the mid-pressure storage reservoir 150 (FIG. 1) using the purified dense-phase fluid. Typically, the dense-phase fluid is compressed to a pressure in excess of 100 psi. The pressure chosen should be adequate to liquefy the dense-phase fluid. By supplying the proper pressure, when another cleaning cycle is begun, the pressure of reservoir 150 serves to fill chamber 110 (FIG. 1), completing the fluid cycle. The heat exchanger 160 (FIG. 1) is used to control the phase of the dense-phase fluid entering the chamber 110. Using the pressure from the mid-pressure storage tank to fill the cleaning chamber 110 eliminates the need for a liquid pump and condenser, and affords much simpler and less expensive operation, thus providing a significant benefit to the end user.

The foregoing descriptions of specific embodiments of the present invention are presented for purposes of illustration and description. They are not intended to be exhaustive or to limit the invention to the precise forms disclosed. For example, any methods described herein are merely examples intended to illustrate one way of performing the invention. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method is not necessarily intended to occur in the sequence laid out. It is intended that the scope of the invention be defined by the following claims and their equivalents.

What is claimed:

1. A method for cleaning semiconductor substrates, comprising:
   introducing at least one semiconductor substrate into a cleaning chamber that is configured and dimensioned to withstand internal pressures up to approximately 1500 psi, said internal pressure of the cleaning chamber being maintained between about 400 and 1500 psi during said cleaning;
   introducing a dense-phase cleaning fluid into said cleaning chamber;
   controlling a temperature and pressure of said dense-phase fluid using a temperature control device;
   applying a localized high-pressure fluid at a pressure substantially higher than 1500 psi at the surface of said semiconductor substrate, wherein said fluid pressure is substantially higher than 1500 psi at its point of discharge near the surface of said semiconductor substrate, wherein said applying comprises applying said high-pressure fluid via one or more nozzles at a predetermined distance from said semiconductor substrate and said cleaning chamber is operated in a manner such that the high-pressure fluid contacts the substrate at a pressure higher than 1500 psi while the internal pressure of the cleaning chamber is maintained between about 400 and 1500 psi;
   expelling said dense-phase cleaning fluid and said high-pressure fluid from said cleaning chamber; and
   removing said semiconductor substrate.

2. The method for cleaning semiconductor substrates of claim 1, wherein said dense-phase cleaning fluid comprises co-solvent.

3. The method for cleaning semiconductor substrates of claim 1, wherein said high-pressure fluid is substantially a co-solvent.

4. The method for cleaning of claim 1, wherein said applying comprises injecting said high-pressure fluid via a nozzle having at least one orifice of variable diameter.

5. The method for cleaning of claim 1, wherein said applying compnses spraying said high-pressure fluid via a nozzle that is configured and dimensioned to withstand internal pressures of approximately 4000 psi.

6. The method for cleaning of claim 1, further comprising, before said expelling, sonicating said dense-phase cleaning fluid.

7. The method for cleaning of claim 1, further comprising, before said expelling, immersing said semiconductor substrate in said dense-phase fluid for a predetermined time period.

8. The method for cleaning of claim 1, wherein said high-pressure fluid is applied at a localized pressure of 4000 psi at the nozzle.

9. The method for cleaning semiconductor substrates of claim 2, wherein said high-pressure fluid comprises co-solvent.

10. The method for cleaning semiconductor substrates of claim 3 wherein said co-solvent is amphiphilic.

11. A method for cleaning semiconductor substrates, comprising:
    providing a cleaning chamber having an inlet for receiving a dense-phase cleaning fluid, and an outlet, said cleaning chamber being configured and dimensioned to withstand internal pressures up to approximately 1500 psi, said internal pressure of the cleaning chamber being maintained between about 400 and 1500 psi during said cleaning;

providing a nozzle disposed within said cleaning chamber;

introducing at least one semiconductor substrate into said cleaning chamber;

introducing a dense-phase cleaning fluid into said cleaning chamber through said inlet;

controlling a temperature and pressure of said dense-phase cleaning fluid using a temperature control device;

sonicating said dense-phase cleaning fluid;

immersing said semiconductor substrate in said dense-phase cleaning fluid for a predetermined time period;

applying a localized co-solvent fluid near the surface of said semiconductor substrate, where said co-solvent fluid is applied through said nozzle at between about 1500 and about 4000 psi, while the internal pressure of the cleaning chamber is maintained between about 400 and 1500 psi;

expelling said dense-phase cleaning fluid and said co-solvent from said cleaning chamber through said outlet; and removing said semiconductor substrate.

* * * * *